(12) United States Patent
Srivastava

(10) Patent No.: US 10,937,646 B1
(45) Date of Patent: Mar. 2, 2021

(54) METHOD FOR ISOLATING GATES IN TRANSISTORS

(71) Applicant: APPLIED Materials, Inc., Santa Clara, CA (US)

(72) Inventor: Aseem K. Srivastava, Andover, MA (US)

(73) Assignee: Applied Materials, Inc., Santa Clara, CA (US)

( * ) Notice: Subject to any disclaimer, the term of this patent is extended or adjusted under 35 U.S.C. 154(b) by 50 days.

(21) Appl. No.: 16/573,653

(22) Filed: Sep. 17, 2019

(51) Int. Cl.
*H01L 21/02* (2006.01)
*H01L 21/321* (2006.01)
*H01L 21/027* (2006.01)

(52) U.S. Cl.
CPC .... *H01L 21/02244* (2013.01); *H01L 21/0274* (2013.01); *H01L 21/02172* (2013.01); *H01L 21/321* (2013.01)

(58) Field of Classification Search
None
See application file for complete search history.

(56) References Cited

U.S. PATENT DOCUMENTS

2014/0197415 A1* 7/2014 You ............... H01L 29/4908
257/59

* cited by examiner

*Primary Examiner* — Zandra V Smith
*Assistant Examiner* — Lawrence C Tynes, Jr.
(74) *Attorney, Agent, or Firm* — Kacvinsky Daisak Bluni PLLC

(57) ABSTRACT

A method of forming an electrically insulating barrier between a source contact and a drain contact of a transistor device including an electrically insulating layer disposed atop a semi-conductive layer, and an electrically conductive layer disposed atop the electrically insulating layer, the source contact and the drain contact extending from the electrically conductive layer through the electrically insulating layer to the semi-conductive layer, the method including disposing a hardmask layer atop the electrically conductive layer, disposing a photoresist layer atop the hardmask layer, performing a photolithography process to form a trench in the hardmask layer to expose an underlying portion of the electrically conductive layer spanning between the source contact and the drain contact, and performing an ion implantation process, wherein an ion beam formed of ionized oxygen atoms is directed into the trench to oxidize the exposed portion of the electrically conductive layer.

20 Claims, 2 Drawing Sheets

METHOD FOR ISOLATING GATES IN TRANSISTORS

FIELD OF THE DISCLOSURE

Embodiments of the present disclosure relate to transistor device fabrication techniques, and more particularly, to a technique for electrically isolating a source contact and a drain contact of a transistor device relative to one another during fabrication of the transistor device.

BACKGROUND OF THE DISCLOSURE

In modern transistor devices, a source and a drain are typically formed within a layer of silicon or other semi-conducting material capped by a layer of electrically insulating material, such as silicon dioxide. The source and the drain are provided with external electrical connections by forming trenches in the silicon dioxide layer extending from the surface of the silicon dioxide layer to the source and the drain. A layer of cobalt (or other electrically conductive material), sometimes referred to as the "M0 metal layer," is deposited atop the silicon dioxide layer, wherein the cobalt covers the silicon dioxide layer and also fills the trenches to form source and drain contacts extending from the surface of the silicon dioxide layer to the source and the drain, respectively. Since the cobalt layer extends over the surface of the silicon dioxide layer and is contiguous with the source contact and the drain contact, an insulative barrier needs to be formed in the cobalt layer to electrically isolate the source contact from the drain contact.

In order to form an electrically insulating barrier in the cobalt layer, a number of processes are typically performed. For example, a carbon hardmask layer may be deposited atop the cobalt layer, and a photoresist layer may be deposited atop the carbon hardmask layer. A photolithography process is then performed, wherein a portion of the photoresist layer is etched away to form an aperture in the photoresist layer above a portion of the cobalt layer extending between the source contact and the drain contact. The hole is then transferred to the hardmask layer via an etching process. The photoresist layer is then removed, and an ion beam etching process is performed, wherein an ion beam formed of reactive plasma ions is directed into the aperture in the hardmask layer and impinges on the underlying portion of the cobalt layer. The cobalt layer is etched by the ion beam to form a gap in the cobalt layer between the source contact and the drain contact. The gap is then backfilled with an insulating filler, such as aluminum oxide, to form a "plug." The insulting filler plug may then be subjected to various process, such as chemical metal polishing and recess etching, for example. Finally, the hardmask layer is stripped away. The insulating filler plug thus provides an electrically insulating barrier in the cobalt layer and electrically isolates the source contact from the drain contact.

The above-described processes are complex, time-consuming, and contribute significantly to the manufacturing costs of transistor devices. With respect to these and other considerations, the present improvements may be useful.

SUMMARY

This Summary is provided to introduce a selection of concepts in a simplified form further described below in the Detailed Description. This Summary is not intended to identify key features or essential features of the claimed subject matter, nor is the summary intended as an aid in determining the scope of the claimed subject matter.

In accordance with an exemplary embodiment of the present disclosure, a method of forming an electrically insulating barrier between a source contact and a drain contact of a transistor device is provided. The transistor device may include an electrically insulating layer disposed atop a semi-conductive layer, and an electrically conductive layer disposed atop the electrically insulating layer, the source contact and the drain contact extending from the electrically conductive layer through the electrically insulating layer to the semi-conductive layer. The method may include disposing a hardmask layer atop the electrically conductive layer, disposing a photoresist layer atop the hardmask layer, and performing a photolithography process on the photoresist layer and the hardmask layer to form a trench in the hardmask layer to expose an underlying portion of the electrically conductive layer spanning between the source contact and the drain contact. The method may further include performing an ion implantation process, wherein an ion beam formed of ionized oxygen atoms is directed into the trench to oxidize the portion of the electrically conductive layer spanning between the source contact and the drain contact.

In accordance with another exemplary embodiment of the present disclosure, a method of forming an electrically insulating barrier between a source contact and a drain contact of a transistor device is provided. The transistor device may include an electrically insulating layer disposed atop a semi-conductive layer, and an electrically conductive layer disposed atop the electrically insulating layer, the source contact and the drain contact extending from the electrically conductive layer through the electrically insulating layer to the semi-conductive layer. The method may include disposing a hardmask layer atop the electrically conductive layer, disposing a photoresist layer atop the hardmask layer, and performing a photolithography process. The photolithography process may include masking the photoresist layer, exposing the photoresist layer to radiation, developing the photoresist layer to form an aperture therein, and performing an ion etching process wherein an ion beam formed of reactive plasma ions is directed into the aperture to etch a trench into hardmask layer and expose an underlying portion of the conductive layer spanning between the source contact and the drain contact. The method may further include performing an ion implantation process, wherein an ion beam formed of ionized oxygen atoms is directed into the trench to oxidize the portion of the electrically conductive layer spanning between the source contact and the drain contact to electrically isolate the source contact from the drain contact.

In accordance with another exemplary embodiment of the present disclosure, a method of forming an electrically insulating barrier in a layer of electrically conductive material may include disposing a hardmask layer atop the electrically conductive layer, disposing a photoresist layer atop the hardmask layer, and performing a photolithography process on the photoresist layer and the hardmask layer. The photolithography process may include forming a trench in the hardmask layer to expose an underlying portion of the electrically conductive layer. The method may further include performing an ion implantation process, wherein an ion beam formed of ionized oxygen atoms is directed into the trench to oxidize the portion of the exposed portion of the electrically conductive layer.

BRIEF DESCRIPTION OF THE DRAWINGS

By way of example, various embodiments of the disclosed techniques will now be described with reference to the accompanying drawings, wherein.

DETAILED DESCRIPTION

Figure 1A:
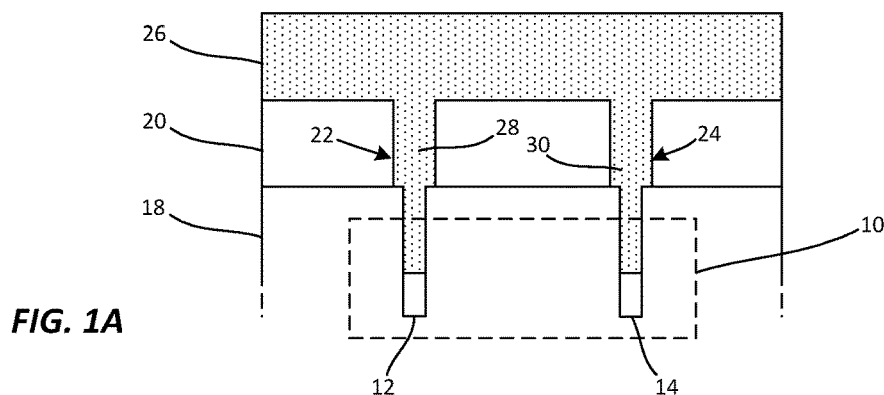
FIGS. 1A-1F are a series of cross-sectional views illustrating a method for forming an electrically insulating barrier between a source contact and a drain contact of a transistor device in accordance with an exemplary embodiment of the present disclosure.

The present embodiments will now be described more fully hereinafter with reference to the accompanying drawings, wherein some exemplary embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

The present disclosure is directed to providing a novel technique for forming electrically insulating barriers within electrically conductive materials, and in particular a novel technique for forming an electrically insulating barrier between a source contact and a drain contact of a transistor device. The technique of the present disclosure will be described with reference to a series of schematic, cross-sectional views shown in FIGS. 1A-1F illustrating various, exemplary processes performed as part of the disclosed technique.

Referring to FIG. 1A, a generic transistor device 10 is illustrated and may include a source 12 and a drain 14 formed within a substrate layer 18 made of silicon or other semi-conducting material, for example. The term "transistor device" is used generically herein and may refer to any type of transistor device structure having a source and a drain and being amenable to fabrication using the processes disclosed herein. Exemplary transistor devices include, and are not limited to, field effect transistors (FETs), bipolar junction transistors (BJTs), and the like. Thus, the transistor device 10 is illustrated generically in the figures with various components being omitted. Those of ordinary skill in the art will understand the transistor device 10 may include numerous additional elements and structures depending on the particular type of transistor device being implemented. Those of ordinary skill in the art will further appreciate the technique and processes of the present disclosure may also be implemented in the fabrication of various other electronic components requiring electrical isolation between electrically conductive elements.

A layer of electrically insulating material (hereinafter "the insulating layer 20") may be disposed on top of the substrate layer 18. In a non-limiting, exemplary embodiment of the present disclosure, the insulating layer 20 may be formed of silicon dioxide. The present disclosure is not limited in this regard. A pair of trenches 22, 24 may be formed in the insulating layer 20 and may extend from a top surface of the insulating layer 20 to the source 12 and to the drain 14, respectively. A layer of electrically conductive material (hereinafter "the conductive layer 26") may be disposed on top of the insulating layer 20, and a pair of electrically conductive prongs 28, 30 (hereinafter "the source contact 28" and "the drain contact 30") may extend downwardly from the conductive layer 26 and may fill the trenches 22, 24. Particularly, the source contact 28 and the drain contact 30 may be contiguous with the conductive layer 26, and may provide electrical pathways between the conductive layer 26 and the source 12 and the drain 14, respectively. In a non-limiting, exemplary embodiment of the present disclosure, the conductive layer 26, the source contact 28, and the drain contact 30 may be formed of cobalt. The present disclosure is not limited in this regard, and one or more of the conductive layer 26, the source contact 28, and the drain contact 30 may be formed of various other electrically conductive materials, including, and not limited to, copper, gold, silver, etc.

Figure 1B:
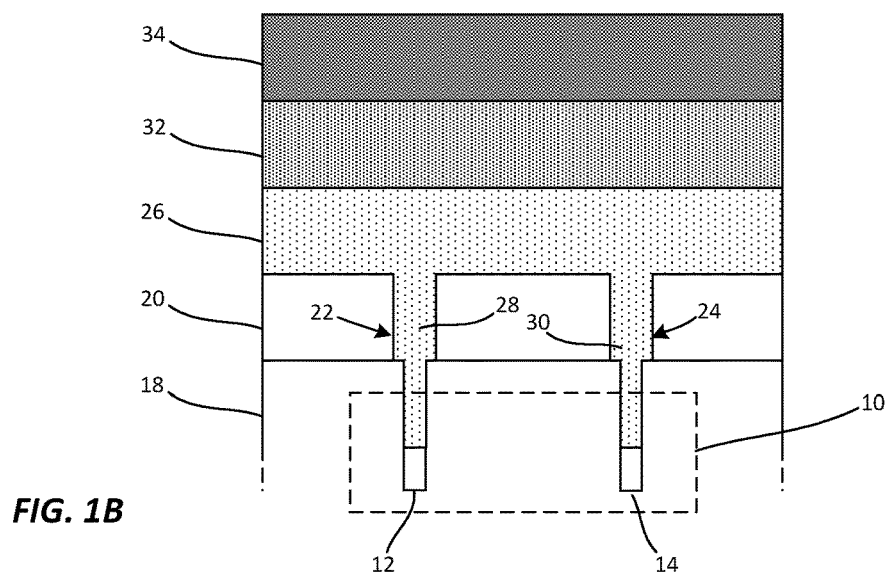

Referring to FIG. 1B, a hardmask layer 32 may be disposed on top of the conductive layer 26, and a photoresist layer 34 may be disposed on top of the hardmask layer 32. The hardmask layer 32 may be formed of any conventional hardmask material, including, and not limited to, amorphous silicon, amorphous carbon, etc. The photoresist layer 34 may be formed of any suitable, light-sensitive organic material familiar to those of ordinary skill in the art.

Figure 1C:
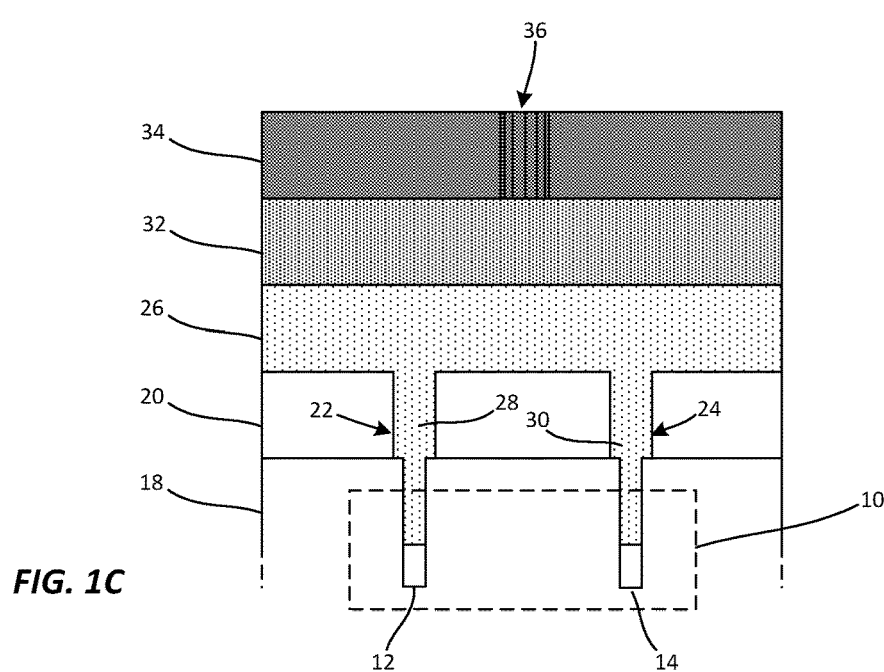
Figure 1D:
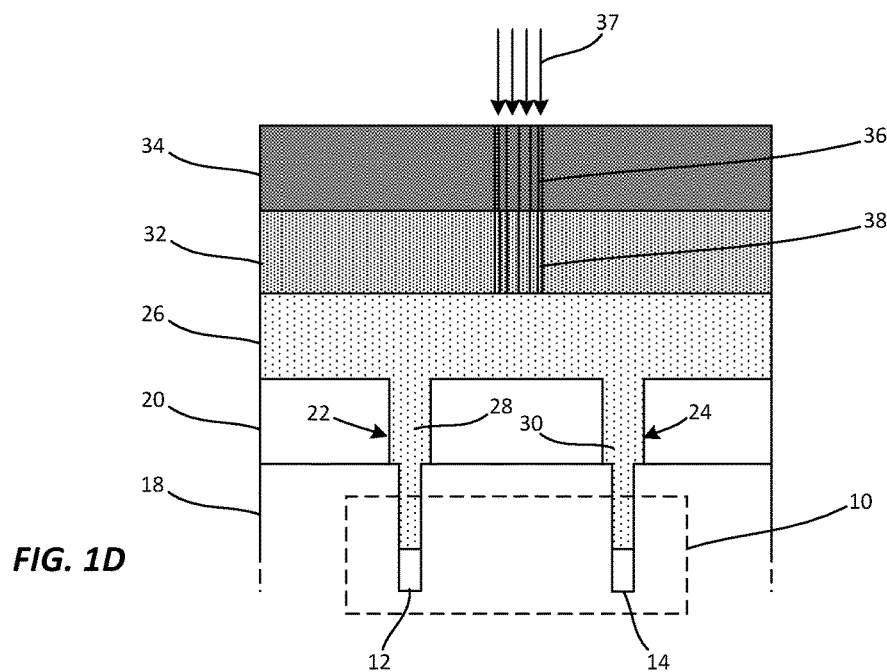

Referring to FIG. 1C, a conventional photolithography process may be performed, wherein the photoresist layer 34 may be masked, exposed to a radiation source, and developed in a manner familiar to those of ordinary skill in the art to form a hole, slot, or aperture 36 (hereinafter "the aperture 36") in the photoresist layer 34. The aperture 36 may be located above a portion of the conductive layer 26 spanning between the source contact 28 and the drain contact 30. Referring to FIG. 1D, the photolithography process may further include an ion etching process (e.g., a reactive-ion etching process), wherein an ion beam 37 formed of reactive plasma ions may be directed into the aperture 36 at an angle perpendicular to the upper surface of the hardmask layer 32. The ion beam 37 may etch the hardmask layer 32, thus forming a trench 38 extending entirely through the hardmask layer 32 and exposing an upper surface of the underlying portion of the conductive layer 26. Specifically, a portion of the conductive layer 26 extending between the source contact 28 and the drain contact 30 may be exposed. The photolithography process may further include removal (e.g., etching or dissolving) of the photoresist layer 34.

Figure 1E:
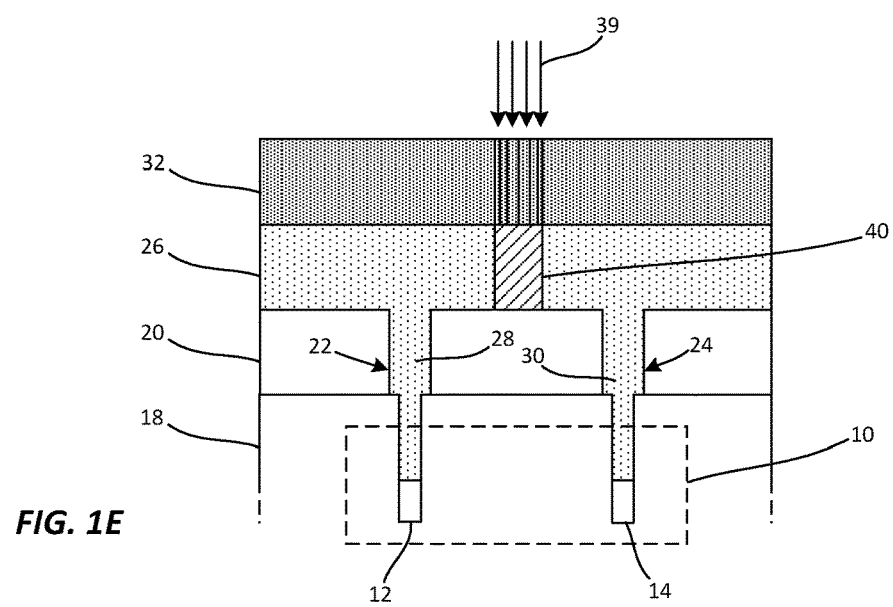

Referring to FIG. 1E, an ion implantation process may be performed, wherein an ion beam 39 formed of ionized oxygen atoms may be directed into the trench 38 at an angle perpendicular to the upper surface of the hardmask layer 32. The ion beam 39 may impinge upon the exposed portion of the conductive layer 26 and may cause oxidation of such portion. In various embodiments, the conductive layer 26 may be implanted (and thus oxidized) by the ion beam 39 to a depth substantially equal to a thickness of the conductive layer 26. In a particular, non-limiting example, the conductive layer 26 may be implanted by the ion beam 39 to a depth of 25 nanometers. The present disclosure is not limited in this regard. Thus, the implanted portion of the conductive layer 26 may be oxidized and made electrically insulating to provide an electrically insulating barrier 40 between the source contact 28 and the drain contact 30. In an experiment, the insulating barrier 40 was found to provide infinite electrical resistance (whereas the pre-implant resistance was approximately 2 Ohms per square nanometer). Thus, the source contact 28 may be effectively electrically isolated from the drain contact 30.

Figure 1F:
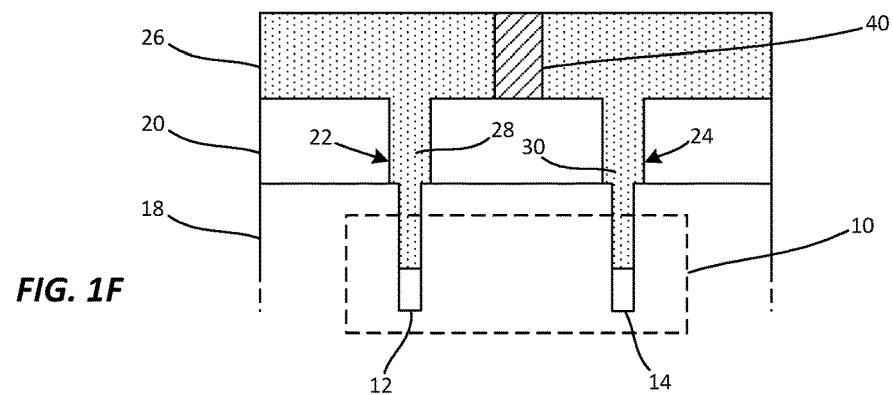

Referring to FIG. 1F, the hardmask layer 32 may be removed from the conductive layer 26 (e.g., via etching or dissolving), and the above described processes may be repeated at various other locations in the conductive layer 26 to create additional insulating barriers therein. Additionally or alternatively, various additional conductive layers (e.g., an M1 metal layer, an M2 metal layer, etc.) may be added atop the conductive layer 26 as may be necessary to suit a particular application (i.e., to fabricate a desired FET device), and the above described processes may be repeated on various portions of such layers.

The above-described technique provides several advantages in the art. For example, the process of forming an oxidized, electrically insulating barrier in a conductive layer via ion implantation as described above replaces numerous processes required in conventional methods of forming an electrically insulating barrier between a source contact and a drain contact of a transistor device. Such processes may include ion etching a conductive layer, backfilling a hole in the conductive layer with an insulating material (e.g., aluminum oxide) to form an insulating plug, and finishing the insulting plug (e.g., via chemical metal polishing and recess etching). Thus, the technique of the present disclosure provides an advantage in that it is less complex than conventional methods of forming an electrically insulating barrier between a source contact and a drain contact of a transistor device. The technique of the present disclosure provides a further advantage in that it can be implemented in a more expeditious manner and at a lower cost relative to conventional methods of forming an electrically insulating barrier between a source contact and a drain contact of a transistor device.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, while the present disclosure has been described herein in the context of a particular implementation in a particular environment for a particular purpose, those of ordinary skill in the art will recognize its usefulness is not limited thereto. Embodiments of the present disclosure may be beneficially implemented in any number of environments for any number of purposes. Accordingly, the claims set forth below shall be construed in view of the full breadth and spirit of the present disclosure as described herein.

The invention claimed is:

1. A method of forming an electrically insulating barrier between a source contact and a drain contact of a transistor device, the transistor device including an electrically insulating layer disposed atop a semi-conductive layer, and an electrically conductive layer disposed atop the electrically insulating layer, the source contact and the drain contact extending from the electrically conductive layer through the electrically insulating layer to the semi-conductive layer, the method comprising:
   disposing a hardmask layer atop the electrically conductive layer;
   disposing a photoresist layer atop the hardmask layer;
   performing a photolithography process on the photoresist layer and the hardmask layer to form a trench in the hardmask layer to expose an underlying portion of the electrically conductive layer spanning between the source contact and the drain contact; and
   performing an ion implantation process, wherein an ion beam formed of ionized oxygen atoms is directed into the trench to oxidize the portion of the electrically conductive layer spanning between the source contact and the drain contact.

2. The method of claim 1, wherein the photolithography process comprises:
   masking the photoresist layer;
   exposing the photoresist layer to radiation; and
   developing the photoresist layer to form an aperture therein.

3. The method of claim 2, wherein the aperture is located above the portion of the electrically conductive layer spanning between the source contact and the drain contact.

4. The method of claim 2, wherein the photolithography process further comprises performing an ion etching process wherein an ion beam formed of reactive plasma ions is directed into the aperture to etch the trench into hardmask layer.

5. The method of claim 4, wherein the trench is located above the portion of the electrically conductive layer spanning between the source contact and the drain contact.

6. The method of claim 2, wherein the photolithography process further comprises removing the photoresist layer.

7. The method of claim 1, wherein the conductive layer, the source contact, and the drain contact are formed of cobalt.

8. The method of claim 1, wherein the insulating layer is formed of silicon dioxide.

9. The method of claim 1, wherein oxidizing the portion of the electrically conductive layer spanning between the source contact and the drain contact electrically isolates the source contact from the drain contact.

10. The method of claim 1, further comprising removing the hardmask layer.

11. The method of claim 1, wherein the transistor device is one of a field effect transistor and a bipolar junction transistor.

12. A method of forming an electrically insulating barrier between a source contact and a drain contact of a transistor device, the transistor device including an electrically insulating layer disposed atop a semi-conductive layer, and an electrically conductive layer disposed atop the electrically insulating layer, the source contact and the drain contact extending from the electrically conductive layer through the electrically insulating layer to the semi-conductive layer, the method comprising:
   disposing a hardmask layer atop the electrically conductive layer;
   disposing a photoresist layer atop the hardmask layer;
   performing a photolithography process comprising:
      masking the photoresist layer;
      exposing the photoresist layer to radiation;
      developing the photoresist layer to form an aperture therein; and
      performing an ion etching process wherein an ion beam formed of reactive plasma ions is directed into the aperture to etch a trench into hardmask layer and expose an underlying portion of the conductive layer spanning between the source contact and the drain contact; and
   performing an ion implantation process, wherein an ion beam formed of ionized oxygen atoms is directed into the trench to oxidize the portion of the electrically conductive layer spanning between the source contact and the drain contact to electrically isolate the source contact from the drain contact.

13. The method of claim 12, wherein the photolithography process further comprises removing the photoresist layer.

14. The method of claim 12, wherein the conductive layer, the source contact, and the drain contact are formed of cobalt.

15. The method of claim 12, wherein the insulating layer is formed of silicon dioxide.

16. The method of claim 12, further comprising removing the hardmask layer.

17. The method of claim 12, wherein the transistor device is one of a field effect transistor and a bipolar junction transistor.

18. A method of forming an electrically insulating barrier in a layer of electrically conductive material, the method comprising:
   disposing a hardmask layer atop the layer of electrically conductive material;
   disposing a photoresist layer atop the hardmask layer;
   performing a photolithography process on the photoresist layer and the hardmask layer to form a trench in the hardmask layer to expose an underlying portion of the layer of electrically conductive material; and
   performing an ion implantation process, wherein an ion beam formed of ionized oxygen atoms is directed into the trench to oxidize the portion of the exposed portion of the layer of electrically conductive material.

19. The method of claim 18, wherein the photolithography process comprises:
   masking the photoresist layer;
   exposing the photoresist layer to radiation; and
   developing the photoresist layer to form an aperture therein.

20. The method of claim 19, wherein the photolithography process further comprises performing an ion etching process wherein an ion beam formed of reactive plasma ions is directed into the aperture to etch the trench into hardmask layer.

* * * * *